United States Patent
Sun

(10) Patent No.: US 9,204,560 B2
(45) Date of Patent: Dec. 1, 2015

(54) MANUFACTURING METHOD OF PACKAGE CARRIER

(71) Applicant: Shih-Hao Sun, Hsinchu County (TW)

(72) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 14/547,147

(22) Filed: Nov. 19, 2014

(65) Prior Publication Data

US 2015/0068034 A1 Mar. 12, 2015

Related U.S. Application Data

(62) Division of application No. 13/615,698, filed on Sep. 14, 2012, now abandoned.

(30) Foreign Application Priority Data

Aug. 8, 2012 (TW) .............................. 101128619 A

(51) Int. Cl.
| | |
|---|---|
| *H05K 3/12* | (2006.01) |
| *H05K 3/42* | (2006.01) |
| *H01L 23/498* | (2006.01) |
| *H01L 21/48* | (2006.01) |
| *H01L 21/447* | (2006.01) |
| *H01L 33/64* | (2010.01) |

(52) U.S. Cl.
CPC ............... *H05K 3/42* (2013.01); *H01L 21/447* (2013.01); *H01L 21/486* (2013.01); *H01L 23/49827* (2013.01); *H01L 33/642* (2013.01); *H01L 2224/16227* (2013.01); *H01L 2924/15311* (2013.01); *Y10T 29/49165* (2015.01)

(58) Field of Classification Search
CPC .. H05K 3/42; H01L 23/49827; H01L 21/486; H01L 33/642; H01L 21/447; H01L 2924/15311; H01L 2224/16227; Y10T 29/49165
See application file for complete search history.

(56) References Cited

U.S. PATENT DOCUMENTS

| | | |
|---|---|---|
| 6,432,748 B1 | 8/2002 | Hsu |
| 7,354,798 B2 | 4/2008 | Pogge et al. |

FOREIGN PATENT DOCUMENTS

| | | | |
|---|---|---|---|
| CN | 1447639 A | * | 10/2003 |
| JP | 2004179575 A | * | 6/2004 |

* cited by examiner

*Primary Examiner* — Carl Arbes
(74) *Attorney, Agent, or Firm* — Jianq Chyun IP Office

(57) ABSTRACT

A manufacturing method of a package carrier is provided. An insulation substrate having an upper surface, a lower surface, plural cavities located at the lower surface and plural through holes passing through the insulation substrate and respectively communicating with the cavities is provided. Plural vias is defined by the cavities and the through holes. A conductive material filling up the vias is formed to define plural conductive posts. An insulation layer having a top surface and plural blind vias extending from the top surface to the conductive posts is formed on the upper surface. A patterned circuit layer filling up the blind vias, being connected to the conductive posts and exposing a portion of the top surface is formed on the top surface. A solder mask layer is formed on the patterned circuit layer and has plural openings exposing a portion of the patterned circuit layer to define plural pads.

11 Claims, 3 Drawing Sheets

MANUFACTURING METHOD OF PACKAGE CARRIER

CROSS-REFERENCE TO RELATED APPLICATION

This application is a divisional application of and claims the priority benefit of U.S. application Ser. No. 13/615,698, filed on Sep. 14, 2012, now pending. The prior application Ser. No. 13/615,698 claims the priority benefit of Taiwan application serial no. 101128619, filed on Aug. 8, 2012. The entirety of each of the above-mentioned patent applications is hereby incorporated by reference herein and made a part of this specification.

BACKGROUND

1. Field of the Invention

The invention relates to a manufacturing method of a package structure, and more particularly, to a manufacturing method of a package carrier.

2. Description of Related Art

The purpose of chip package is to protect exposed chips, to reduce contact density in a chip, and to provide good thermal dissipation for chips. A leadframe serving as a carrier of a chip is usually employed in a conventional wire bonding technique. As contact density in a chip gradually increases, the leadframe which is unable to satisfy current demands on the high contact density is replaced by a package carrier which can achieve favorable contact density. Besides, the chip is packaged onto the package carrier by conductive media, such as conductive wires or bumps.

Take a light-emitting diode (LED) package structure commonly used at present time as an example. A LED chip has to be packaged before used, and the LED chip generates a large amount of heat when emitting light. Therefore, if the heat generated by the LED chip cannot be dissipated and keeps accumulating in the LED package structure, a temperature of the LED package structure would keep rising. In this way, the LED chip may be overheated, which causes luminance decay and shortens operating life thereof or even causes permanent damage in server cases.

As the integration level of integrated circuits increases, due to the mismatch of thermal expansion coefficient between the LED chip and the package carrier, the phenomena of thermal stress and warpage become more and more severe, and that causes the reliability between the LED chip and the package carrier to decrease. Therefore, in addition to enhancing the light extraction efficiency, the current package technology focuses on decreasing the thermal stress of the package structure to increase the operating life and the reliability of the package structure.

SUMMARY OF THE INVENTION

The invention provides a manufacturing method of a package carrier for manufacturing the aforementioned package carrier which effectively decreases a thermal expansion difference when the package carrier carries a heating element and increases a using reliability.

The invention provides a manufacturing method of a package carrier. The manufacturing method includes the following steps. An insulation substrate is provided. The insulation substrate has an upper surface, a lower surface opposite to the upper surface, a plurality of cavities and a plurality of through holes. The cavities are located at the lower surface, and the through holes pass through the insulation substrate and respectively communicate with the cavities to define a plurality of vias. A conductive material is formed in the vias, wherein the conductive material fills up the vias to define a plurality of conductive posts. An insulation layer is formed on the upper surface of the insulation substrate. The insulation layer has a top surface relatively far from the upper surface of the insulation substrate and a plurality of blind vias extending from the top surface to the conductive posts. A patterned circuit layer is formed on the top surface of the insulation layer. The patterned circuit layer fills up the blind vias and is connected to the conductive posts. The patterned circuit layer exposes a portion of the top surface of the insulation layer. A solder mask layer is formed on the patterned circuit layer. The solder mask layer covers the patterned circuit layer and the exposed portion of the top surface of the insulation layer. The solder mask layer has a plurality of openings, wherein the openings expose a portion of the patterned circuit layer so as to define a plurality of pads.

In an embodiment of the invention, a material of the insulation substrate includes ABF resin, polymeric materials, silicon fillers or epoxy resin.

In an embodiment of the invention, a method of forming the cavities of the insulation substrate includes laser drilling or injection molding.

In an embodiment of the invention, a method of forming the through holes of the insulation substrate includes laser drilling.

In an embodiment of the invention, steps of forming the conductive material in the vias include: performing an electroless plating process to form the conductive material on the upper surface, the lower surface and in the vias of the insulation substrate, wherein the conductive material covers the upper surface and the lower surface of the insulation substrate and fills up the vias; and removing a portion of the conductive material on the upper surface and the lower surface of the insulation substrate to expose the upper surface and the lower surface of the insulation substrate so as to define the conductive posts.

In an embodiment of the invention, each of the conductive posts has a first surface and a second surface opposite to each other. The first surface of each of the conductive posts and the upper surface of the insulation substrate are coplanar, and the second surface of each of the conductive posts and the lower surface of the insulation substrate are coplanar.

In an embodiment of the invention, a method of forming the insulation layer includes thermal compression bonding.

In an embodiment of the invention, a material of the insulation layer includes ABF resin, polymeric materials, silicon fillers or epoxy resin.

In an embodiment of the invention, a method of forming the blind vias of the insulation layer includes laser drilling.

In an embodiment of the invention, a method of forming the patterned circuit layer includes electroless plating or a semi-additive process.

In an embodiment of the invention, the manufacturing method further includes forming a surface treatment layer on the pads after the solder mask layer is formed.

In an embodiment of the invention, the surface treatment layer includes an electroplated gold layer, an electroplated silver layer, a reduced gold layer, a reduced silver layer, an electroplated nickel-palladium-gold layer, a nickel-palladium-gold layer or an organic solderability preservatives (OSP) layer.

Based on the above, the manufacturing method of the package carrier of the invention uses an insulation substrate with an ideal thermal expansion coefficient as a core. Therefore, when the package carrier is used in the package of a heating element (such as a chip) subsequently, a difference in thermal expansion coefficient between the package carrier and the heating element carried on the package carrier is reduced effectively, which prevents a stress between the heating element and the insulation substrate from increasing because of a too great difference in thermal expansion coefficient therebetween and effectively prevents the peeling and damage of the heating element from happening, thereby enhancing the using reliability of the package carrier.

In order to make the aforementioned features and advantages of the invention more comprehensible, embodiments accompanying figures are described in details below.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the invention.

DESCRIPTION OF EMBODIMENTS

FIGS. 1A to 1H are schematic cross-sectional views of a manufacturing method of a package carrier according to an embodiment of the invention. According to the manufacturing method of the package carrier of the present embodiment, referring to FIG. 1A, an insulation substrate 110 is provided first. The insulation substrate 110 has an upper surface 112, a lower surface 114 opposite to the upper surface 112 and a plurality of cavities 116, wherein the cavities 116 are located at the lower surface 114 of the insulation substrate 110. Herein, a method of forming the cavities 116 of the insulation substrate 110 is, for example, laser drilling or injection molding. In addition, a material of the insulation substrate 110 is, for example, ABF resin, polymeric materials, silicon fillers or epoxy resin.

Figure 1A:
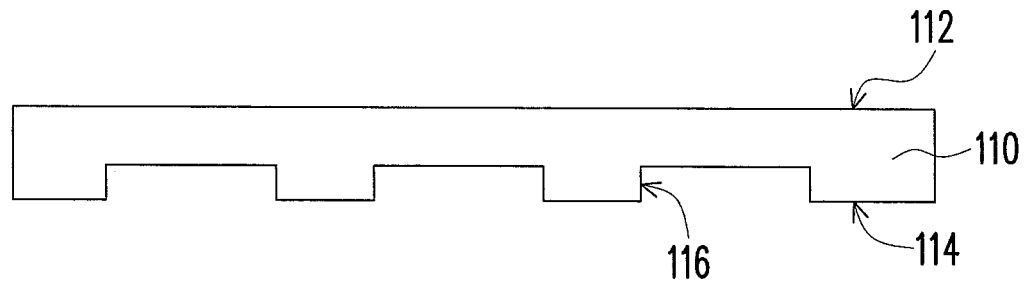
FIGS. 1A to 1H are schematic cross-sectional views of a manufacturing method of a package carrier according to an embodiment of the invention.
Figure 1B:
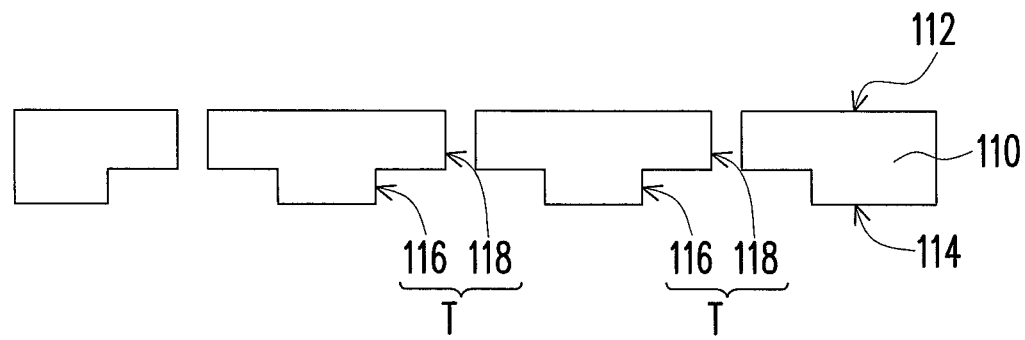

Then, referring to FIG. 1B, through holes 118 passing through the insulation substrate 110 and respectively communicating with the cavities 116 are formed on the upper surface 112 of the insulation substrate 110. Herein, each of the through holes 118 and the corresponding cavity 116 define a via T, and a diameter of each of the through holes 118 is substantially less than a diameter of each of the cavities 116. In addition, a method of forming the through holes 118 is, for example, laser drilling.

Figure 1C:
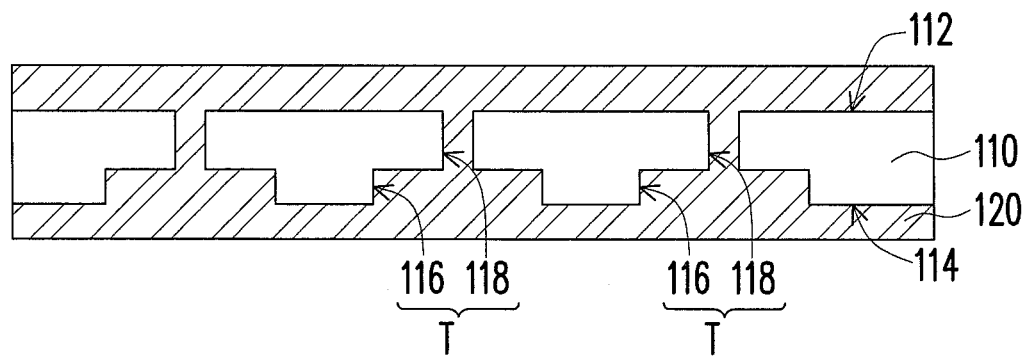

Then, referring to FIG. 1C, an electroless plating process is performed to form a conductive material 120 on the upper surface 112, the lower surface 114 and in the vias T of the insulation substrate 110. The conductive material 120 covers the upper surface 112 and the lower surface 114 of the insulation substrate 110 and fills up the vias T, wherein the conductive material 120 is copper, for example.

Figure 1D:
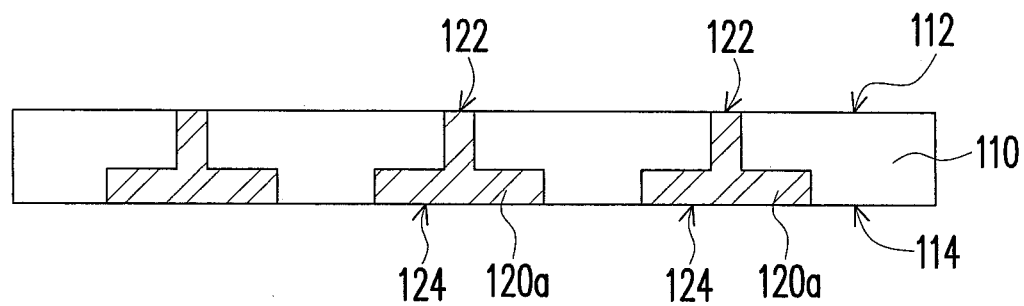

Then, referring to FIG. 1D, a portion of the conductive material 120 on the upper surface 112 and the lower surface 114 of the insulation substrate 110 is removed to expose the upper surface 112 and the lower surface 114 of the insulation substrate 110 so as to define a plurality of conductive posts 120a. Herein, each of the conductive posts 120a has a first surface 122 and a second surface 124 opposite to each other. The first surface 122 of each of the conductive posts 120a and the upper surface 112 of the insulation substrate 110 are substantially coplanar, and the second surface 124 of each of the conductive posts 120a and the lower surface 114 of the insulation substrate 110 are substantially coplanar.

Figure 1E:
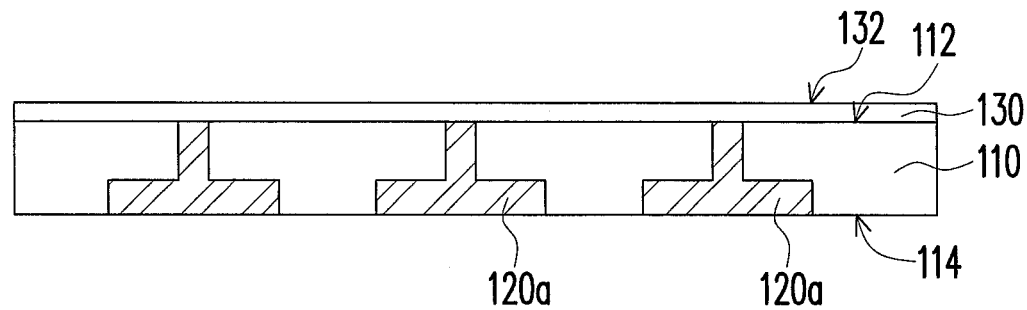

Then, referring to FIG. 1E, an insulation layer 130 is formed on the upper surface 112 of the insulation substrate 110, wherein the insulation layer 130 has a top surface 132 relatively far from the upper surface 112 of the insulation substrate 110. Herein, a method of forming the insulation layer 130 is thermal compression bonding, for example. In addition, a material of the insulation layer 130 is, for example, ABF resin, polymeric materials, silicon fillers or epoxy resin.

Figure 1F:
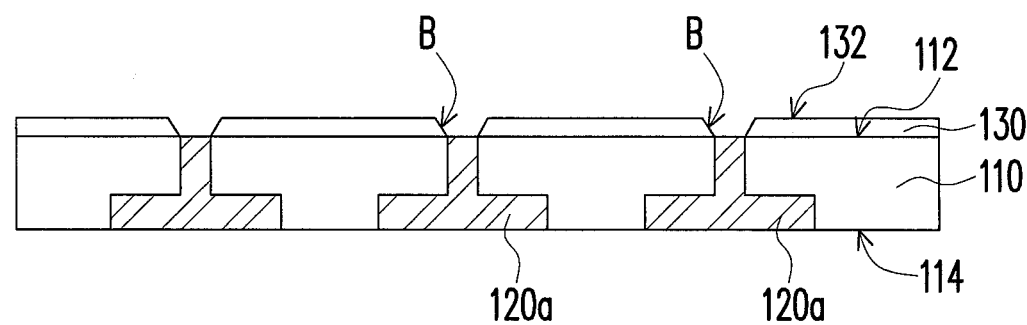

Then, referring to FIG. 1F, blind vias B extending from the top surface 132 of the insulation layer 130 to the conductive posts 120a are formed, wherein the blind vias B respectively expose the first surface 122 of the conductive posts 120a. Herein, a method of forming the blind vias B of the insulation layer 130 is laser drilling, for example.

Figure 1G:
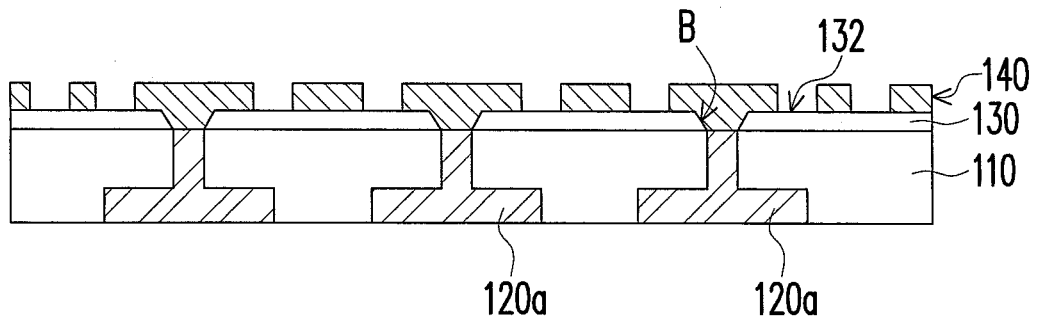

Then, referring to FIG. 1G, a patterned circuit layer 140 is formed on the top surface 132 of the insulation layer 130, wherein the patterned circuit layer 140 fills up the blind vias B and is structurally and electrically connected to the conductive posts 120a, and the patterned circuit layer 140 exposes a portion of the top surface 132 of the insulation layer 130. Herein, a method of forming the patterned circuit layer 140 is, for example, electroless plating or a semi-additive process, which is not limited herein.

Figure 1H:
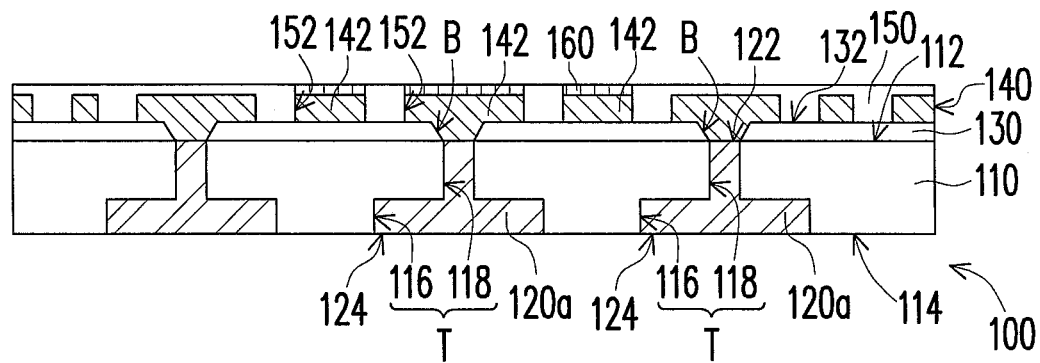

Finally, referring to FIG. 1H, a solder mask layer 150 is formed on the patterned circuit layer 140, wherein the solder mask layer 150 covers the patterned circuit layer 140 and the exposed portion of the top surface 132 of the insulation layer 130. Herein, the solder mask layer 150 has a plurality of openings 152, wherein the openings 152 expose a portion of the patterned circuit layer 140 to define a plurality of pads 142. In addition, the manufacturing method of the package carrier of the present embodiment may further include forming a surface treatment layer 160 on the pads 142, wherein the surface treatment layer 160 is, for example, an electroplated gold layer, an electroplated silver layer, a reduced gold layer, a reduced silver layer, an electroplated nickel-palladium-gold layer, a nickel-palladium-gold layer or an organic solderability preservatives (OSP) layer. Herein, a method of forming the surface treatment layer 160 is, for example, electro-plating or electroless plating, which is not limited herein. To this point, the manufacturing of the package carrier 100 is completed.

Regarding structures, referring to FIG. 1H again, the package carrier 100 of the present embodiment includes the insulation substrate 110, the conductive posts 120a, the insulation layer 130, the patterned circuit layer 140 and the solder mask layer 150. The insulation substrate 110 has an upper surface 112, a lower surface 114 opposite to the upper surface 112, a plurality of cavities 116 and a plurality of through holes 118, wherein the diameter of each of the through holes 118 is substantially less than the diameter of each of the cavities 116. The cavities 116 are located at the lower surface 114, and the through holes 118 pass through the insulation substrate 110 and respectively communicate with the cavities 116 to define the vias T. The conductive posts 120a are respectively disposed in the vias T, and each of the conductive posts 120a has the first surface 122 and the second surface 124 opposite to each other. The first surface 122 of each of the conductive posts 120a and the upper surface 112 of the insulation substrate 110 are substantially coplanar, and the second surface 124 of each of the conductive posts 120a and the lower surface 114 of the insulation substrate 110 are substantially coplanar. The insulation layer 130 is disposed on the upper surface 112 of the insulation substrate 110. The insulation layer 130 has the top surface 132 relatively far from the upper surface 112 of the insulation substrate 110 and the blind vias B extending from the top surface 132 to the conductive posts 120a. The patterned circuit layer 140 is disposed on the top surface 132 of the insulation layer 130 and exposes a portion of the top surface 132 of the insulation layer 130. The patterned circuit layer 140 fills up the blind vias B and is connected to the conductive posts 120a. The solder mask layer 150 is disposed on the patterned circuit layer 140, and the solder mask layer 150 covers the patterned circuit layer 140 and the exposed portion of the top surface 132 of the insulation layer 130. The solder mask layer 150 has the plurality of openings 152, wherein the openings 152 expose a portion of the patterned circuit layer 140 to define the pads 142. In addition, the package carrier 100 of the present embodiment may further include the surface treatment layer 160 disposed on the pads 142, wherein the surface treatment layer 160 is, for example, an electroplated gold layer, an electroplated silver layer, a reduced gold layer, a reduced silver layer, an electroplated nickel-palladium-gold layer, a nickel-palladium-gold layer or an OSP layer.

Since the present embodiment uses the insulation substrate 110 as the core of the package carrier 100, wherein the insulation substrate 110 has an ideal thermal expansion coefficient (similar to a thermal expansion coefficient of a heating element used subsequently, for example), when the package carrier 100 is used in the package of a heating element (not shown) subsequently, a difference in thermal expansion coefficient between the package carrier 100 and the heating element carried on the package carrier 100 is reduced, which prevents a stress between the heating element and the insulation substrate 110 from increasing because of a too great difference in thermal expansion coefficient therebetween and effectively prevents the peeling and damage of the heating element from happening, thereby enhancing the using reliability of the package carrier 100. In addition, since the patterned circuit layer 140 of the present embodiment is formed by electroless plating or by the semi-additive process, a width of the patterned circuit layer 140 is able to meet the specification of fine circuits.

Figure 2:
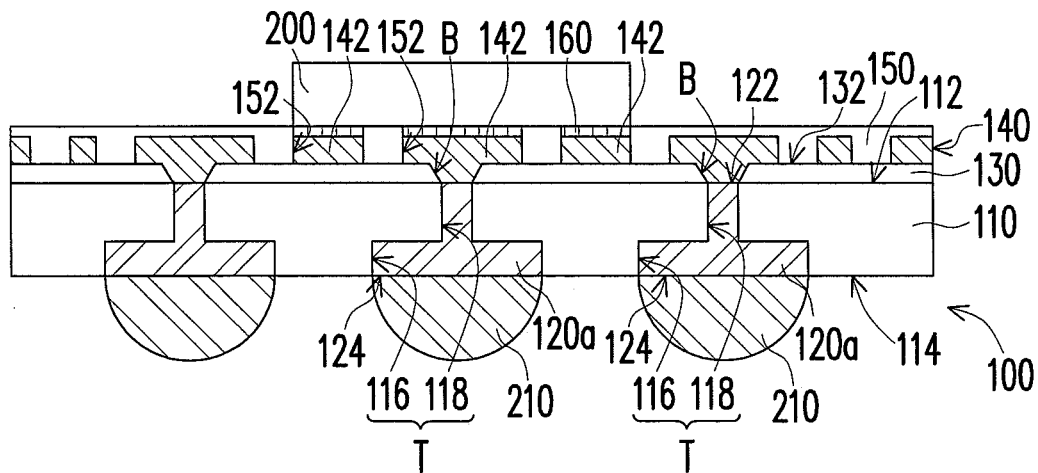
FIG. 2 is a schematic cross-sectional view of the package carrier of FIG. 1H carrying a heating element.

FIG. 2 is a schematic cross-sectional view of the package carrier of FIG. 1H carrying a heating element. In the present embodiment, the package carrier 100 is adapted for carrying a heating element 200, wherein the heating element 200 is disposed on the surface treatment layer 160 on the pads 142 exposed by the openings 152 of the solder mask layer 150. The heating element 200 is, for example, an electronic chip or a photoelectric device but is not limited thereto. For example, the electronic chip may be an integrated circuit chip, such as a single chip (like a graphic chip, a memory chip, or a semiconductor chip) or a chip module. The photoelectric device is, for example, a LED, a laser diode or a gas-discharge light source. Herein, the heating element 200 being a LED serves as an example.

In detail, the heating element 200 (such as a semiconductor chip) may be electrically connected to the surface treatment layer 160 by flip chip bonding. Since the present embodiment uses the insulation substrate 110 with an ideal thermal expansion coefficient as the core of the package carrier 100, a difference in thermal expansion coefficient between the package carrier 100 and the heating element 200 is gradually reduced. In this way, a stress between the heating element 200 and the package carrier 100 can be prevented from increasing because of a too great difference in thermal expansion coefficient therebetween, and the peeling and damage of the heating element 200 is effectively prevented from happening, thereby enhancing the using reliability of the package carrier 100. Furthermore, when the heating element 200 is disposed on the package carrier 100, heat generated by the heating element 200 is transmitted to the outside rapidly through the surface treatment layer 160, the patterned circuit layer 140 and the conductive posts 120a. In this way, the package carrier 100 of the present embodiment effectively dissipates the heat generated by the heating element 200, thereby enhancing the using efficiency and operating life of the heating element 200. In addition, a plurality of solder balls 210 may be disposed on the lower surface 114 of the insulation substrate 110 of the package carrier 100 of the present embodiment, and the package carrier 100 may be electrically connected to an external circuit (not shown) through the solder balls 210, which effectively enhances the application of the package carrier 100.

In summary of the above, the manufacturing method of the package carrier of the invention uses an insulation substrate with an ideal thermal expansion coefficient as a core. Therefore, when the package carrier is used in the package of a heating element (such as a chip) subsequently, a difference in thermal expansion coefficient between the package carrier and the heating element carried on the package carrier is reduced effectively, which prevents a stress between the heating element and the insulation substrate from increasing because of a too great difference in thermal expansion coefficient therebetween and effectively prevents the peeling and damage of the heating element from happening, thereby enhancing the using reliability of the package carrier.

Although the invention has been described with reference to the above embodiments, they are not intended to limit the invention. It is apparent to people of ordinary skill in the art that modifications and variations to the invention may be made without departing from the spirit and scope of the invention. In view of the foregoing, the protection scope of the invention will be defined by the appended claims.

What is claimed is:

1. A manufacturing method of a package carrier, comprising:
   providing an insulation substrate, the insulation substrate having an upper surface, a lower surface opposite to the upper surface, a plurality of cavities and a plurality of through holes, wherein the cavities are located at the lower surface, and the through holes pass through the insulation substrate and respectively communicate with the cavities to define a plurality of vias, and a diameter of each of the through holes is substantially less than a diameter of each of the cavities;
   performing an electroless plating process to form a conductive material on the upper surface, the lower surface and in the vias of the insulation substrate, wherein the conductive material covers the upper surface and the lower surface of the insulation substrate and fills up the vias;
   removing a portion of the conductive material on the upper surface and the lower surface of the insulation substrate to expose the upper surface and the lower surface of the insulation substrate, wherein the conductive material fills up the vias to define a plurality of conductive posts;
   forming an insulation layer on the upper surface of the insulation substrate, wherein the insulation layer has a top surface relatively far from the upper surface of the insulation substrate and a plurality of blind vias extending from the top surface to the conductive posts;
   forming a patterned circuit layer on the top surface of the insulation layer, wherein the patterned circuit layer fills up the blind vias and is connected to the conductive posts, and the patterned circuit layer exposes a portion of the top surface of the insulation layer; and forming a solder mask layer on the patterned circuit layer, the solder mask layer covering the patterned circuit layer and the exposed portion of the top surface of the insulation layer, the solder mask layer having a plurality of openings, wherein the openings expose a portion of the patterned circuit layer to define a plurality of pads.

2. The manufacturing method of the package carrier as recited in claim 1, wherein a material of the insulation substrate includes ABF resin, polymeric materials, silicon fillers or epoxy resin.

3. The manufacturing method of the package carrier as recited in claim 1, wherein a method of forming the cavities of the insulation substrate includes laser drilling or injection molding.

4. The manufacturing method of the package carrier as recited in claim 1, wherein a method of forming the through holes of the insulation substrate includes laser drilling.

5. The manufacturing method of the package carrier as recited in claim 1, wherein each of the conductive posts has a first surface and a second surface opposite to each other, the first surface of each of the conductive posts and the upper surface of the insulation substrate are coplanar, and the second surface of each of the conductive posts and the lower surface of the insulation substrate are coplanar.

6. The manufacturing method of the package carrier as recited in claim 1, wherein a method of forming the insulation layer includes thermal compression bonding.

7. The manufacturing method of the package carrier as recited in claim 1, wherein a material of the insulation layer includes ABF resin, polymeric materials, silicon fillers or epoxy resin.

8. The manufacturing method of the package carrier as recited in claim 1, wherein a method of forming the blind vias of the insulation layer includes laser drilling.

9. The manufacturing method of the package carrier as recited in claim 1, wherein a method of forming the patterned circuit layer includes electroless plating or a semi-additive process.

10. The manufacturing method of the package carrier as recited in claim 1, further comprising:
    forming a surface treatment layer on the pads after the solder mask layer is formed.

11. The manufacturing method of the package carrier as recited in claim 10, wherein the surface treatment layer comprises an electroplated gold layer, an electroplated silver layer, a reduced gold layer, a reduced silver layer, an electroplated nickel-palladium-gold layer, a nickel-palladium-gold layer or an organic solderability preservatives (OSP) layer.

* * * * *